(12) United States Patent
Chen et al.

(10) Patent No.: US 10,101,659 B2
(45) Date of Patent: Oct. 16, 2018

(54) LITHOGRAPHY METHOD WITH SURFACE MODIFICATION LAYER

(71) Applicant: Taiwan Semiconductor Manufacturing Co., Ltd., Hsin-Chu (TW)

(72) Inventors: Shu-Fang Chen, Hsinchu County (TW); Hung-Chung Chien, Chiayi County (TW); Lin-Hung Shiu, Hsinchu (TW); Hung-Chang Hsieh, Hsin-Chu (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 20 days.

(21) Appl. No.: 15/355,359

(22) Filed: Nov. 18, 2016

(65) Prior Publication Data
US 2018/0047561 A1   Feb. 15, 2018

Related U.S. Application Data

(60) Provisional application No. 62/374,616, filed on Aug. 12, 2016.

(51) Int. Cl.
  *G03F 7/09*  (2006.01)
  *H01L 21/027*  (2006.01)
  *H01L 21/02*  (2006.01)
  *H01L 21/266*  (2006.01)

(52) U.S. Cl.
  CPC .......... *G03F 7/091* (2013.01); *H01L 21/0226* (2013.01); *H01L 21/0271* (2013.01); *H01L 21/0276* (2013.01); *H01L 21/02118* (2013.01); *H01L 21/02126* (2013.01); *H01L 21/02343* (2013.01); *H01L 21/266* (2013.01); *H01L 21/02266* (2013.01); *H01L 21/02282* (2013.01)

(58) Field of Classification Search
  CPC ...................................................... G03F 7/091
  See application file for complete search history.

(56) References Cited

U.S. PATENT DOCUMENTS

| 8,216,767 | B2 | 7/2012 | Wang et al. |
| 8,323,870 | B2 | 12/2012 | Lee et al. |
| 8,580,117 | B2 | 11/2013 | Kao et al. |
| 8,658,344 | B2 | 2/2014 | Wang et al. |
| 8,715,919 | B2 | 5/2014 | Chang et al. |
| 8,741,551 | B2 | 6/2014 | Wu et al. |
| 2005/0130079 | A1* | 6/2005 | Endo ............ G03F 7/2041 430/327 |
| 2006/0057507 | A1* | 3/2006 | Chang ............ G03F 7/091 430/327 |
| 2013/0288482 | A1* | 10/2013 | Nam ............ H01L 21/0273 438/703 |
| 2013/0323641 | A1 | 12/2013 | Chang |
| 2014/0011133 | A1 | 1/2014 | Liu et al. |
| 2014/0017615 | A1 | 1/2014 | Chang |
| 2014/0017616 | A1 | 1/2014 | Chang |
| 2014/0065843 | A1 | 3/2014 | Chang et al. |
| 2014/0117563 | A1 | 5/2014 | Yu et al. |
| 2014/0120459 | A1 | 5/2014 | Liu et al. |
| 2014/0186773 | A1 | 7/2014 | Chang |
| 2014/0255850 | A1 | 9/2014 | Chang et al. |
| 2014/0272709 | A1 | 9/2014 | Liu et al. |
| 2014/0272726 | A1 | 9/2014 | Chang |
| 2014/0273521 | A1 | 9/2014 | Wu et al. |

* cited by examiner

*Primary Examiner* — Kathleen Duda
(74) *Attorney, Agent, or Firm* — Haynes and Boone, LLP

(57) ABSTRACT

A lithography method is provided in accordance with some embodiments. The lithography method includes forming a surface modification layer on a substrate, the surface modification layer including a hydrophilic top surface; coating a photoresist layer on the surface modification layer; and developing the photoresist layer, thereby forming a patterned photoresist layer.

21 Claims, 10 Drawing Sheets

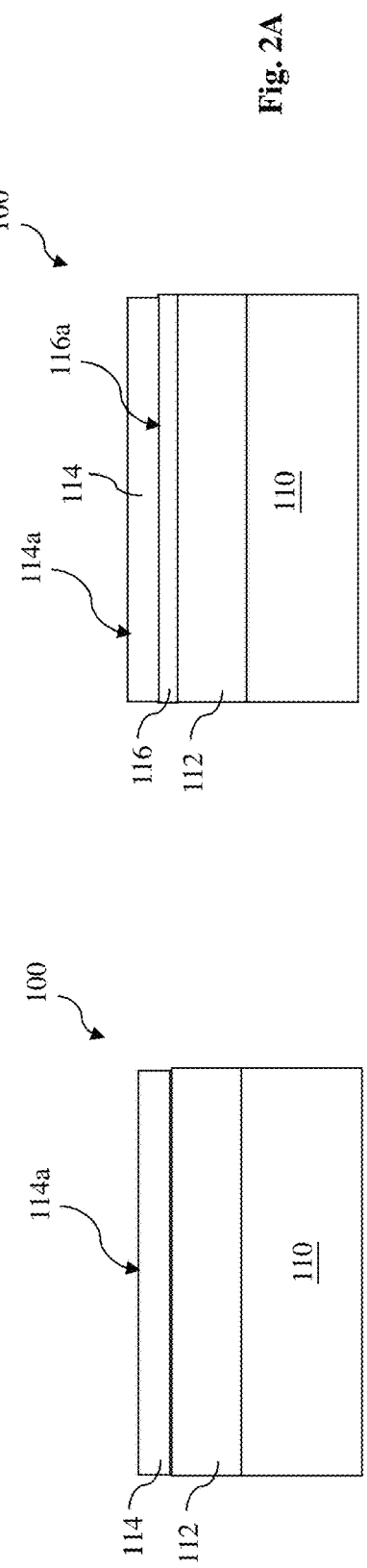
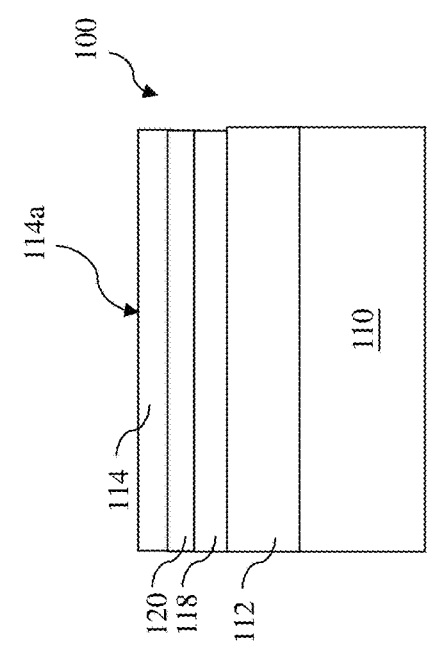
Fig. 1
Fig. 2A
Fig. 2B

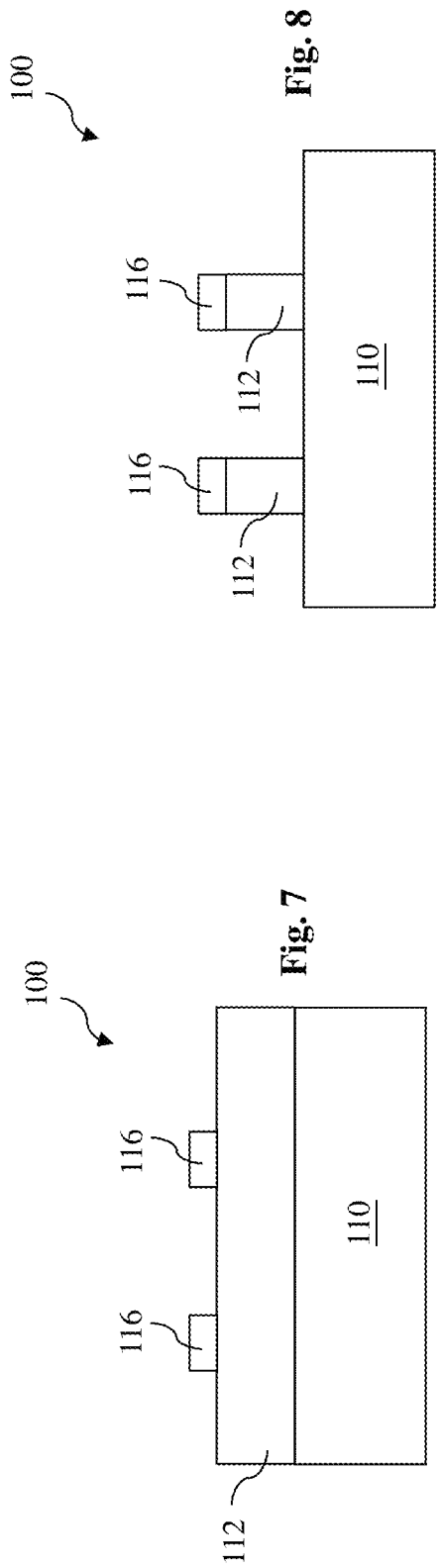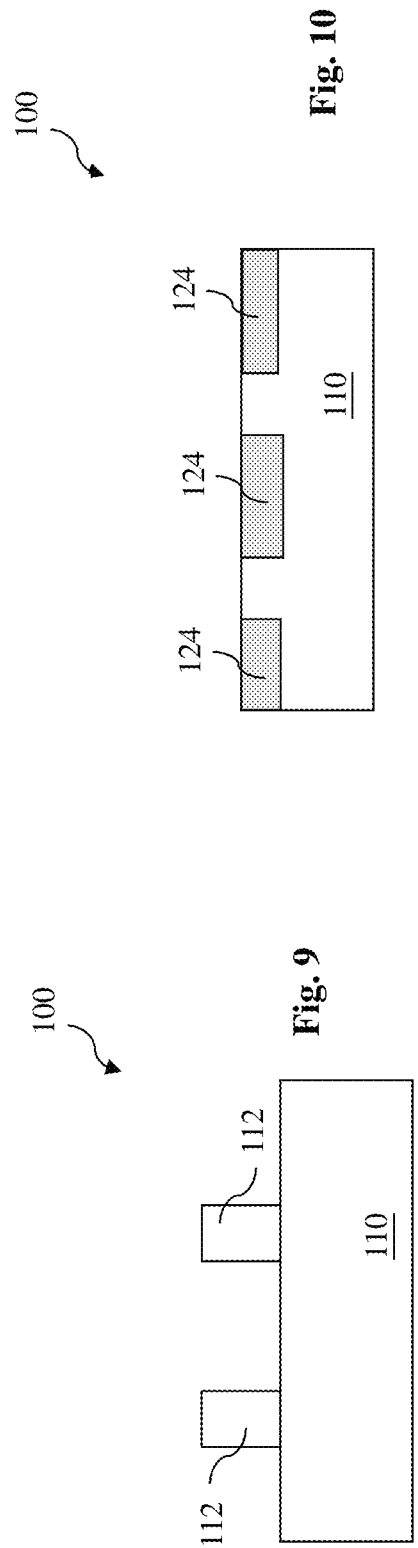

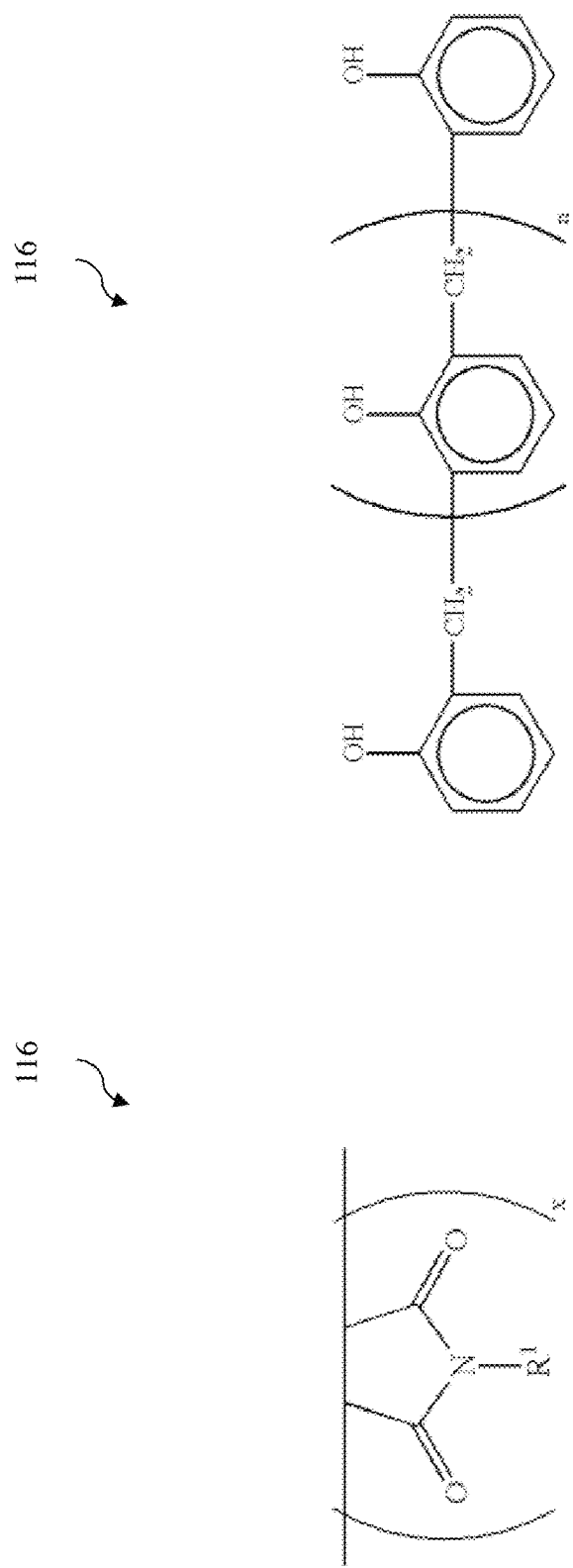

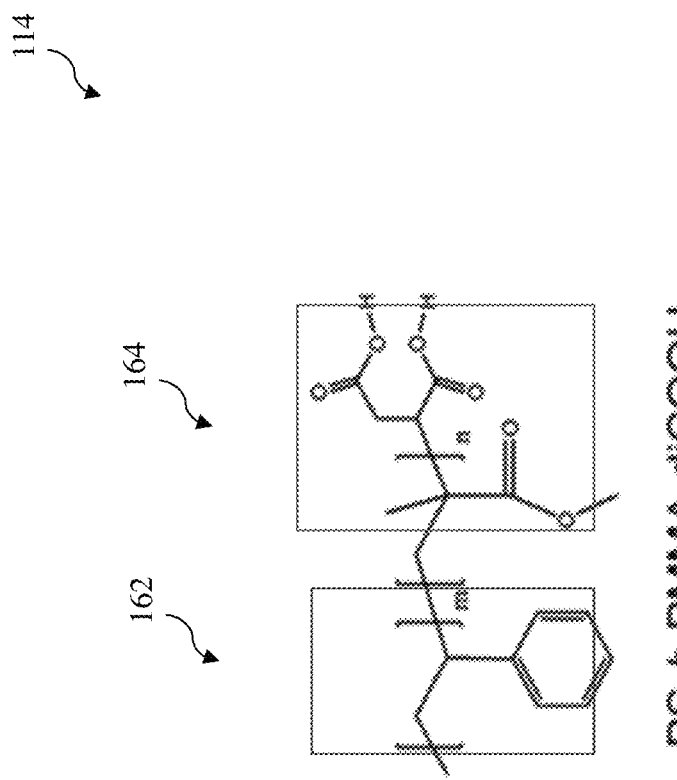

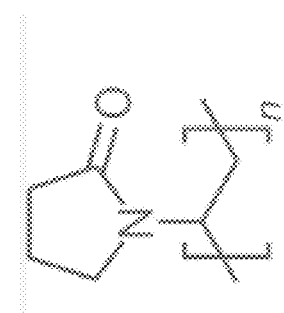
polyvinylpyrrolidone
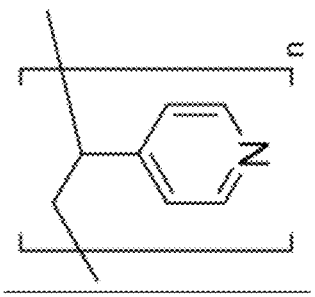
polyvinylpyridine
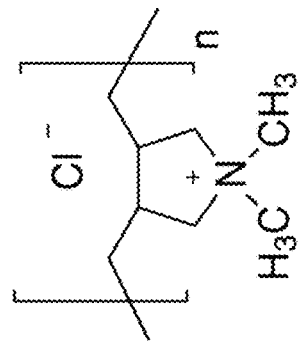
poly(diallydimethyl ammonium chloride)
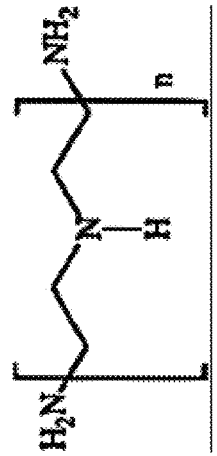
polyethyleneimine
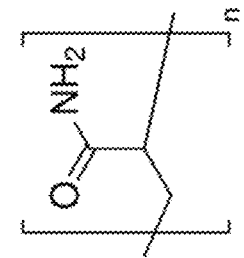
polyacrylamide
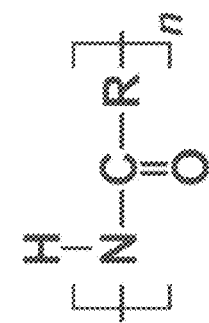
polyamide
Fig. 17

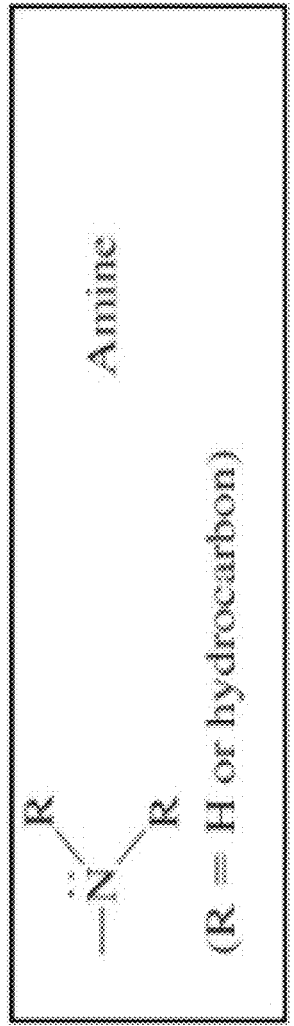
Fig. 18

LITHOGRAPHY METHOD WITH SURFACE MODIFICATION LAYER

This application claims the benefit of U.S. Provisional Application 62/374,616 entitled "LITHOGRAPHY METHOD WITH SURFACE MODIFICATION LAYER," filed Aug. 12, 2016, herein incorporated by reference in its entirety.

BACKGROUND

In integrated circuit (IC) fabrications, a patterned photoresist layer is used to transfer a designed pattern having small feature sizes from a photomask to a wafer. The photoresist is light-sensitive and can be patterned by a photolithography process. Furthermore, the photoresist layer provides resistance to etch or ion implantation, which further requires a sufficient thickness. During a lithography patterning process, the photoresist is exposed and developed to form a patterned photoresist layer. To reduce feature size and increase pattern density, multiple patterning techniques are used in advanced technology nodes, which changes relative pattern density photoresist in each patterning. However, after the formation of the patterned photoresist layer, some defects, such as water stains and solvent remains, are formed thereon, reducing the image quality and causing patterning issues. This is more problematic to advanced technology nodes and multiple patterning processes.

Therefore, there is need for a lithography method to address the above issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 3 through 10 illustrate sectional views of one exemplary semiconductor structure at various fabrication stages, constructed in accordance with some embodiments.

FIGS. 2A and 2B illustrate sectional views of one exemplary semiconductor structure, constructed in accordance with some embodiments.

FIGS. 11 and 12 are diagrammatical views of a chemical structure in a BARC layer used in a photolithography process, constructed in accordance with some embodiments.

FIG. 16 is a diagrammatical view of a chemical structure in a surface modification layer used in a photolithography process, constructed in accordance with some embodiments.

FIG. 17 is a diagrammatical view of various hydrophilic chemical structures in a surface modification layer used in a photolithography process, constructed in accordance with some embodiments.

FIG. 18 is a diagrammatical view of various hydrophilic chemical structures in a surface modification layer used in a photolithography process, constructed in accordance with some embodiments.

DETAILED DESCRIPTION

Figure 4:
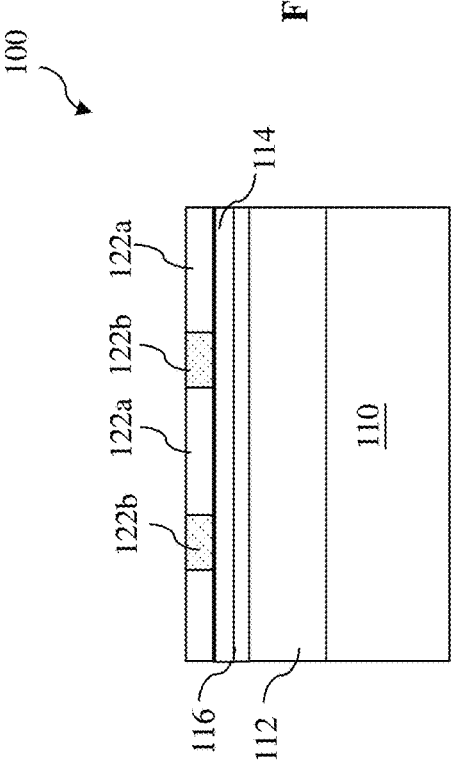

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIGS. 1, 2A, 2B and 3 through 10 provide sectional views of a semiconductor structure 100 at various fabrication stages in accordance with some embodiments. The semiconductor structure 100 and the method making the same are collectively described with reference to FIGS. 1, 2A, 2B, and 3-18.

Referring to FIG. 1, the semiconductor structure device 100 is a semiconductor wafer in the present embodiment. The semiconductor structure 100 includes a semiconductor substrate 110, such as a silicon substrate in some embodiments. The substrate 110 may include another elementary semiconductor, such as germanium, or diamond in some embodiments. The substrate 110 may include a compound semiconductor, such as silicon carbide, gallium arsenic, indium arsenide, and indium phosphide. The substrate 110 may include an alloy semiconductor, such as silicon germanium, silicon germanium carbide, gallium arsenic phosphide, and gallium indium phosphide. The substrate 110 may include one or more epitaxial semiconductor layer, such as semiconductor layer(s) epitaxially grown on a silicon substrate. For example, the substrate may have an epitaxial layer overlying a bulk semiconductor. Further, the substrate may be strained for performance enhancement. For example, the epitaxial layer may include semiconductor materials different from those of the bulk semiconductor such as a layer of silicon germanium overlying bulk silicon, or a layer of silicon overlying a bulk silicon germanium formed by a process including selective epitaxial growth (SEG). Furthermore, the substrate 110 may include a semiconductor-on-insulator (SOI) structure. For examples, the substrate may include a buried oxide (BOX) layer formed by a process such as separation by implanted oxygen (SIMOX). In other embodiments, the substrate 110 may include a glass such as in thin film transistor (TFT) technologies.

The semiconductor structure 100 may also include other material layers and other circuit patterns. For examples. The semiconductor structure 100 includes various doped features, such as doped well structure (e.g., a P-typed doped well and an N-type doped well) formed in the semiconductor substrate 110. In other embodiments, the semiconductor structure 100 may further include one or more material layer 112 to be patterned (by etching to remove or ion implantation to introduce dopants), such as a dielectric layer to be patterned to form trenches for conductive lines or holes for contacts or vias; a gate material stack to be patterned to form gates; or a semiconductor material to be patterned to form isolation trenches. For example, a material layer to be patterned is a semiconductor layer as a part of the semiconductor substrate 110. In other embodiments, multiple semiconductor material layers, such as gallium arsenic (GaAs) and aluminum gallium arsenic (AlGaAs), are epitaxially grown on the semiconductor substrate and are patterned to form various devices, such as light-emitting diodes (LEDs). In some other embodiments, the semiconductor structure 100 includes fin active regions and three dimensional fin field-effect transistors (FinFETs) formed or to be formed thereon.

Still referring to FIG. 1, a surface modification layer 114 is formed on the semiconductor substrate 100 by a proper technique, such as spin coating. The surface modification layer 114 has a hydrophilic top surface 114a. In various embodiments, other material layer may be further coated on the semiconductor substrate before the surface modification 114 is formed.

In one embodiment as illustrated in FIG. 2A, a bottom anti-reflective coating (BARC) layer 116 is formed on the semiconductor substrate 110 by a proper technique, such as spin-on coating. The BARC layer 116 may serve as an anti-reflective layer during a lithography exposure process and/or a lithography patterning transferring layer during the etching. In the present embodiment, the BARC layer 116 has a hydrophobic top surface 116a after the formation. In one example, the BARC layer 116 is a nitrogen-containing BARC layer having a chemical formulated in FIG. 11. In another example, the BARC layer 116 is a novolac resin type BARC layer having a chemical formulated in FIG. 12. During the formation of the BARC layer, a pre-solution of the BARC material is coated on the substrate and is further baked according to some embodiments. During the high temperature baking process, the hydroxyl groups in the BARC material act as cross-linker, resulting in the BARC layer 116 being hydrophobic due to the consumption of OH groups by the baking. It is found through experiments that the water droplet remains is related to the hydrophobic top surface of the BARC layer.

In another embodiment illustrated in FIG. 2B, a tri-layer photoresist is formed on the semiconductor substrate 110. In this case, an under layer 118 is formed on the semiconductor substrate 110. The under layer 118 is designed to provide resistance to etching or ion implantation. The under layer 118 functions as a mask to protects the substrate 110 from etching or ion implantation. Accordingly, the under layer 118 has a sufficient thickness to achieve this. In some embodiments, the under layer 118 includes an organic polymer free of silicon. In some embodiments, the formation of the under layer 118 includes spin-on coating and curing (such as a thermal baking process with a proper baking temperature).

Still referring to FIG. 2B, a middle layer 120 is formed on the under layer 118. The middle layer 120 is a silicon-containing layer designed to provide etch selectivity from the under layer 118. In the present embodiment, the middle layer 120 functions an etch mask to transfer a pattern to the under layer 118. In some embodiments, the middle layer 120 is also designed to function as a bottom anti-reflective coating that reduces reflection during a lithography exposure process, thereby increasing the imaging contrast and enhancing the imaging resolution. The silicon-containing middle layer 120 and the silicon-free under layer 118 are designed to have etching selectivity. In some embodiments, the formation of the middle layer 120 includes spin-on coating and curing (such as a thermal baking process with a suitable baking temperature).

Figure 13:
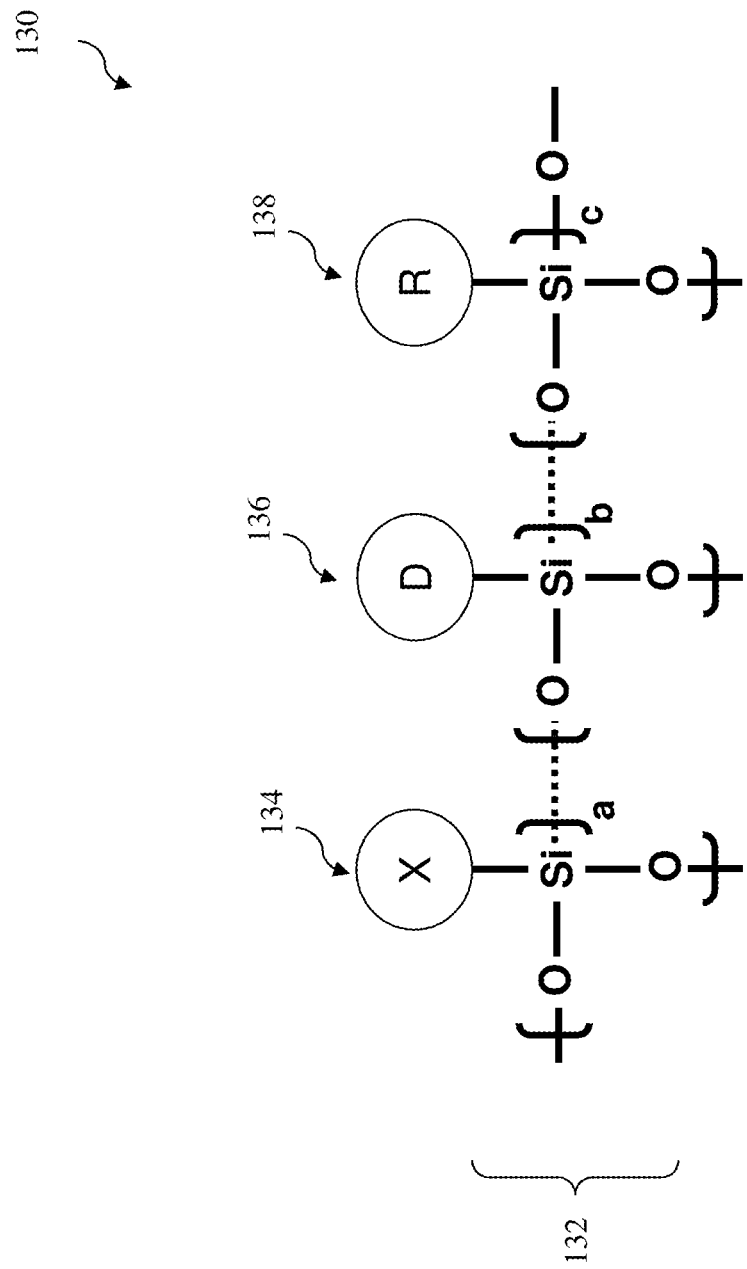
FIG. 13 is a diagrammatical view of a chemical structure in a middle layer used in a photolithography process, constructed in accordance with some embodiments.
Figure 15:
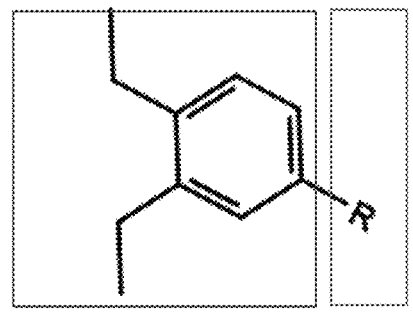
FIGS. 14 and 15 are diagrammatical views of a chemical structure in a surface modification layer used in a photolithography process, constructed in accordance with some embodiments.
Figure 14:
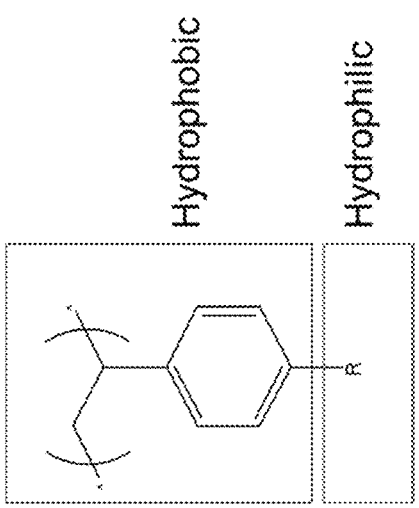

In some examples, the middle layer 120 is designed such that the middle layer 120 is able to be effectively removed by wet stripping without damaging the semiconductor structure 100. The wet strippable middle layer includes a silicon-containing polymer (or simply silicon polymer) 130 with its chemical structure schematically illustrated in FIG. 13 in accordance with some embodiments. Particularly, the wet strippable silicon polymer 130 is designed to have long side chain and have silicon content less than 20% in weight percentage. By having long side chains, the weight percentage of silicon in the middle layer 120 is reduced. Accordingly, the long side chains are easy to be removed relative to the silicon-containing groups. Furthermore, the long side chains reduce the formation of O—Si—O during the dry etching process to pattern the under layer 118. Alternatively, the silicon-containing polymer 130 in the middle layer 120 is designed to have more, and/or longer organic chains. The more and/or longer organic chains will reduces the silicon content of the middle layer 120, which makes the removal of the middle layer easier without damaging the semiconductor structure 100. The composition of the wet strippable middle layer 120 is further described according to various embodiments. The chemical structure of the silicon polymer 130 includes a backbone 132 having a plurality of O—Si—O groups chemically bonded together. In some embodiments, the O—Si—O groups may not be directly bonded together. For example, some other chemical groups may bridge two adjacent O—Si—O groups and bond the two adjacent O—Si—O groups together. The silicon polymer 130 further includes first organic groups 134 (labeled as "X") that provide crosslinking sites; aromatic groups 136 (labeled as "D") that modify the characteristics (such as refractive index n, extinction coefficient κ and/or etch resistance) of the middle layer 120; and second organic groups 138 (labeled as "R") that enhance the adhesion of the photoresist layer and tune other effects, such as etching performance and wet strippability. The backbone 132 of the silicon polymer 130 includes a first subset bonded to the first organic groups 134, a second subset bonded to the aromatic groups 136, and a third subset bonded to the second organic groups 138, as illustrated in FIG. 13. Relative weight percentages of the first, second and third subsets of the O—Si—O groups are "a", "b", and "c", respectively (as labeled in FIG. 13). The sum a, b and c is 1 or 100%. The relative weight percentages a, b and c are adjusted such that various parameters are properly tuned. For example, when the less crosslinking sites are expected, the weight percentage "a" of the first subset of the O—Si—O groups is reduced. As noted above, in addition to respective functions, the chemical groups "X", "D", and "R" are designed to have long chains to further reduce the silicon content of the middle layer 120 and the silicon content of the crust as well, thereby making the removal of the both easier. In some embodiments, the middle layer 120 includes 1-4 alkyl groups bonded to silicon atoms in the backbone 132 by aliphatic or aromatic groups. In some embodiments, the first organic group (X) 134 is a cross-linker, which is an alkyl group having 2-20 carbons (C2-C20) with at least one crosslinkable functional group, such as —I, —Br, —Cl, —NH2, —COOH, —OH, —SH, —N3, epoxy, alkyne, alkene, ketone, aldehyde, ester, acyl halide, NHS ester, Imidoester, pentafluorophenyl ester, Hydroxymethyl phosphine, Carbodiimide, Maleimide, Haloacetyl, Pyridyldisulfide, Thiosulfonate, Vinylsulfone, Hydrazide, Alkoxyamine, Diazirine, Aryl azide, Isocyanate, Phosphine, Amide, ether, or a combination thereof. The weight percentage "a" of the first organic group (X) 134 ranges from 0 to 1 in accordance with some embodiments. In some embodiments, the aromatic group (D) 136 includes a chromophore and includes an alkyl group having 3-20 carbons (C3-C20) with at least one light-sensitive functional group, such as aromatic groups or heterocyclic groups. The aromatic structures can be phenyl, napthlenyl, phenanthrenyl, anthracenyl, phenalenyl, or other aromatic derivatives containing one to five-membered rings. In some embodiments, the second organic group (R) 138 includes an alkyl group having 1-20 carbons (C1-C20) with a non-cyclic structure or a cyclic structure. For example, the cyclic structure is an aromatic ring. The second organic group 138 is designed to enhance photoresist adhesion, etching resistance, and wet strippability. In other examples, the alkyl group further includes a functionalized group, such as —I, —Br, —Cl, —NH2, —COOH, —OH, —SH, —N3, —S(=O)—, alkene, alkyne, imine, ether, ester, aldehyde, ketone, amide, sulfone, acetic acid, cyanide, or a combination thereof. The weight percentage "c" of the second organic group (R) 138 ranges from 0 to 0.5 in accordance with some embodiments.

The following description of the lithography method is based on the embodiment that the BARC layer 116 is formed underlying the surface modification layer 114, as illustrated in FIG. 2A. However, it is used only as one example and is not intended to limit. The same lithography method is also applicable to other embodiments, such as one illustrated in FIG. 1 or one with tri-layer illustrated in FIG. 2B.

Referring back to FIG. 2A, the surface modification layer 114 has a hydrophilic top surface. Accordingly, when the lithography method proceeds to the operations to form patterned photoresist layer, the water stain and solvent remain are eliminated or reduced. The surface modification layer 114 is a polymeric material having hydrophilic characteristics.

In some embodiments, the polymeric material in the surface modification layer 114 includes a hydrophobic backbone with a plurality hydrophilic side chains (chemically or physically) bonded to the hydrophobic back. In one example of the polymeric material illustrated in FIG. 14, the hydrophobic backbone includes polystyrene 142, wherein the label n is an integer and represents a number of styrene bonded together to form the polystyrene 142. A plurality of hydrophilic functional groups 144 (labeled as R in FIG. 14) are bonded to the hydrophobic backbone 142. In some examples, the hydrophilic functional group 144 includes $CH_2CH_2OH$, $CH_2CH_2COOH$, $CH_2SO_3H$, $CH_2PO_4H$, $CH_2NH_2$, $CH_2N(CH_3)_2$, or a combination thereof. In one example of the polymeric material illustrated in FIG. 15, the hydrophobic backbone includes a hydrophobic backbone 152 having a plurality of repeating hydrophobic chemical groups bonded together to form a long chain. A plurality of hydrophilic functional groups 154 (labeled as R in FIG. 15) are bonded to the hydrophobic backbone 152. In some examples, the hydrophilic functional group 154 includes $CH_2CH_2OH$, $CH_2CH_2COOH$, $CH_2SO_3H$, $CH_2PO_4H$, $CH_2NH_2$, $CH_2N(CH_3)_2$, or a combination thereof.

In some embodiments, the polymeric material in the surface modification layer 114 includes a block copolymer having a hydrophobic functional group 162 and a hydrophilic functional group 164 as illustrated in FIG. 16. In the present embodiment, the hydrophobic functional group 162 is polystyrene and the hydrophilic functional group block 166 is poly (methyl methacrylate) di COOH. The label m and n are integers and represent numbers of styrene and methyl methacrylate chemical groups, respectively. The hydrophobic functional group 162 and a hydrophilic functional group 164 are bonded together to form the block copolymer. Especially, the hydrophilic functional group 164 includes a diCOOH group bonded to the poly (methyl methacrylate).

In some embodiments, the polymeric material in the surface modification layer 114 includes hydrophilic functional group, such as hydroxyl group, acid group, or amine group. In furtherance of the embodiments, the polymeric material in the surface modification layer 114 includes polyvinylpyrrolidone, polyvinylpyridine, poly(diallydimethyl ammonium chloride), polyethyleneimine, polyacrylamide, polyamide, a polymer with primary amine group, a polymer with secondary amine group, a polymer with tertiary amine group, a polymer with quaternary ammonium group, or a combination thereof. Some of those chemical structures with hydroxyl group or acid group are further illustrated in FIG. 17, in which label n is an integer. Some of those chemical structures with amine group are further illustrated in FIG. 18.

In some embodiments, the surface modification layer 114 has a thickness less than 5 nm, preferably less than 2 nm. The surface modification layer 114 is formed by spin coating, spray or vapor phase deposition. A pre-solution of the surface modification material is coated on the substrate by one of the above techniques and may be further baked, or collectively baked with subsequently formed photoresist. In some embodiments, before the coating, the pre-solution of the surface modification material is mixed with a resist reduced coating solution, thereby forming a diluted pre-solution, in order to tune the concentration of the pre-solution for optimized performance. In one example, the resist reduced coating solution includes propylene glycol monomethylether and propylene glycol monomethylether acetate, thereby forming a diluted pre-solution. In furtherance of the example, the resist reduced coating solution includes 70% Propylene glycol monomethylether and 30% propylene glycol monomethylether acetate, therefore also being referred to as OK73.

Figure 3:
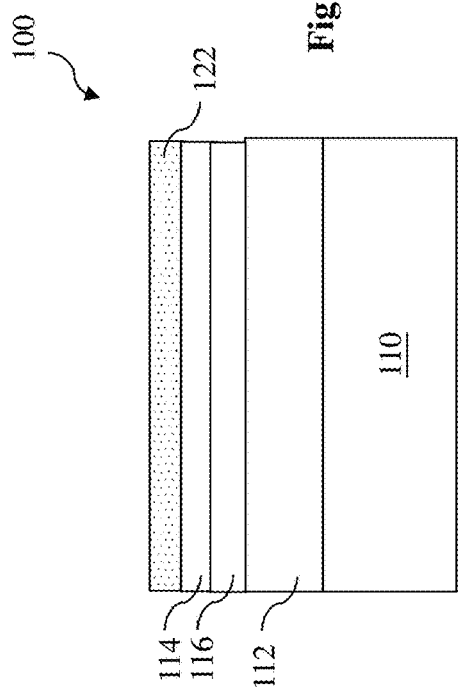

Now referring to FIG. 3, a photoresist layer (photosensitive layer or resist layer) 122 is formed on the surface modification layer 114. As noted above, the surface modification layer 114 provides a hydrophilic top surface. Accordingly, the photoresist layer (photosensitive layer or resist layer) 122 is formed on the hydrophilic top surface of the surface modification layer 114. The formation of the photoresist layer 122 may include spin-on coating and baking process. The photoresist layer 122 may include a photosensitive chemical, a polymeric material and a solvent. In some embodiments, the photosensitive layer 122 utilizes a chemical amplification (CA) resist material. For example, a positive CA resist material includes a polymer material that turns soluble to a developer such as a base solution after the polymeric material is reacted with acid. Alternatively, the CA resist material can be negative and include a polymer material that turns insoluble to a developer such as a base solution after the polymer is reacted with acid. The photoresist layer 122 further includes a solvent. The solvent may be partially evaporated by a soft baking process. In furtherance of the embodiments when the CA resist material is used, the photosensitive chemical includes photo-acid generator (PAG) distributed in the photoresist layer. When absorbing photo energy, the PAG decomposes and forms a small amount of acid. The PAG may have a concentration ranging between about 1% and 30% weight of the photoresist layer 122.

The photoresist layer 122 may additionally include other components, such as a quencher distributed in the solvent and polymeric material. In the present example, the quencher is base type and is capable of neutralizing acid. Collectively or alternatively, the quencher may inhibit other active components of the photoresist layer 116, such as inhibiting photo acid from reaction.

Referring to FIG. 4, the semiconductor structure 100 is then transferred to a lithography apparatus for an exposing process. In one embodiment, the exposing process utilizes a photolithographic technique with proper radiation source and corresponding radiation energy. In the exposing process, the photoresist layer 122 is exposed to a radiation energy through a photomask (mask or reticle) having a predefined pattern, resulting in a latent photoresist pattern that includes a plurality of exposed regions such as exposed features 122a and a plurality of unexposed regions 122b. In some embodiments, the photoresist is designed with composition to be sensitive to the radiation used in the lithography exposure process, such as ultraviolet (UV), deep ultraviolet (DUV), or extreme ultraviolet (EUV). In various examples, the radiation energy may include a 248 nm beam by Krypton Fluoride (KrF) excimer lasers, a 193 nm beam by Argon Fluoride (ArF) excimer lasers, a 157 nm beam by Fluoride (F2) excimer lasers, or Extreme ultra-violet (EUV) light, such as EUV light with wavelength at about 13.5 nm. After the exposing process, other processing steps, such as a post-exposure-baking (PEB) process is followed.

Figure 5:
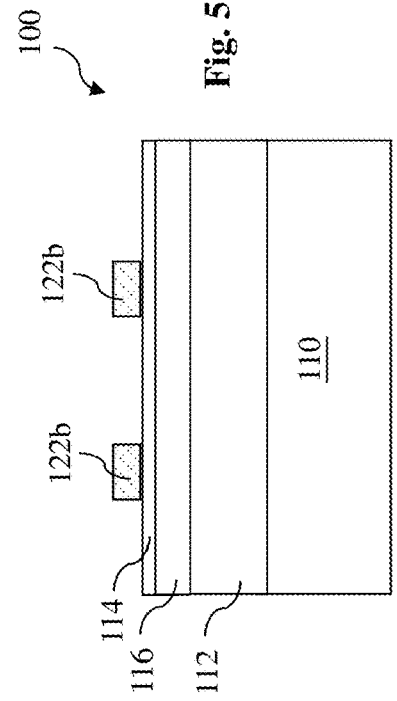

Referring to FIG. 5, the photoresist layer 122 is developed by a developer to form a patterned photoresist layer. In the present example, the photoresist layer 122 has positive-tone, the exposed portions 122a of the photoresist layer are removed by a developer, such as tetramethyl ammonium hydroxide (TMAH). In one example, the developer includes a TMAH solution with a proper concentration, such as about 2.38%. However, negative-tone photoresist layer and/or negative-tone developer may be alternatively used. After the developing, the photoresist layer 122 may proceed to other processing steps, such as a hard-baking process. The exposing process using the photomask and the photolithography apparatus may be implemented or replaced by other proper technique such as maskless photolithography, electron-beam writing, ion-beam writing, and molecular imprint.

In some embodiments, after the developer is applied to the exposed photoresist layer to form the patterned photoresist layer, other steps may follow for cleaning and reducing the defects of the patterned photoresist layer. For example, deionized water (DIW) may be applied to the semiconductor structure 100 by spray and spin. Then a solution, such as FIRM solution, is applied to the semiconductor structure 100 by spin and spray. The FIRM solution includes DIW and surfactant according to some embodiments. Alternatively or additionally, a nitrogen purge is further applied to the semiconductor structure 100.

Figure 6:
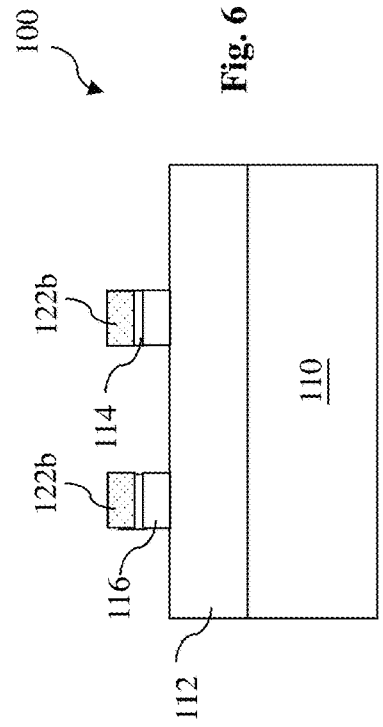

Referring to FIG. 6, a first etching process is applied to the BARC layer 116 using the patterned photoresist layer 122 as an etch mask, thereby transferring the pattern from the patterned photoresist layer 122 to the BARC layer 116.

Referring to FIG. 7, the photoresist layer 122 may be removed by a proper technique, such as wet stripping or plasma ashing, after the BARC layer 122 is patterned by the first etching process. The surface modification layer 114 may be removed as well during the removal of the photoresist layer 122.

Referring to FIG. 8, a second etching process is applied to the material layer 112 using the patterned BARC layer 116 as an etch mask, thereby transferring the pattern from the patterned BARC layer 114 to the material layer 112. In various embodiments, the second etching process may include dry etching, wet etching or a combination thereof, with an etchant selectively etching the material layer 112 while the BARC layer 116 substantially survives. The etching selectivity can be achieved through proper choice of the etchant. For example, when the material layer includes silicon oxide, the second etching process may include wet etching using hydrofloride solution, or dry etching using fluorine-containing gas. In one embodiment where the tri-photoresist layer is used, the first and second etching processes are applied to the middle layer 120 and the under layer 118, respectively. In this case, the first etching process may include dry etching, wet etching or a combination thereof. In the present example, the etching process includes a plasma etching process using an etchant having fluorine, such as CF2, CF3, CF4, C2F2, C2F3, C3F4, C4F4, C4F6, C5F6, C6F6, C6F8, or a combination thereof. The second etching process may include a plasma etching process using an etchant having a sulfur-containing gas and an oxygen-containing gas. In one example, the oxygen-containing gas includes oxygen (O2). In one example, the sulfur-containing gas includes carbonyl sulfide (COS). In another example, the sulfur-containing gas includes sulfur dioxide (SO2).

Referring to FIG. 9, the BARC layer 116 may be removed by a proper process, such as wet etching.

In another embodiment as illustrated in FIG. 10, the material layer 112 is a hard mask layer and an ion implantation process is applied to the semiconductor substrate 110 using the patterned hard mask layer as an implantation mask, thereby forming various doped features 124, such as doped wells, in the semiconductor substrate 110. In furtherance of the embodiments, a dielectric material layer, such as silicon oxide, may be interposed between the semiconductor substrate 110 and the material layer 112 as an ion implantation screening layer to enhance the implantation quality, such as reducing the channeling effect during the ion implantation process.

Figure 19:
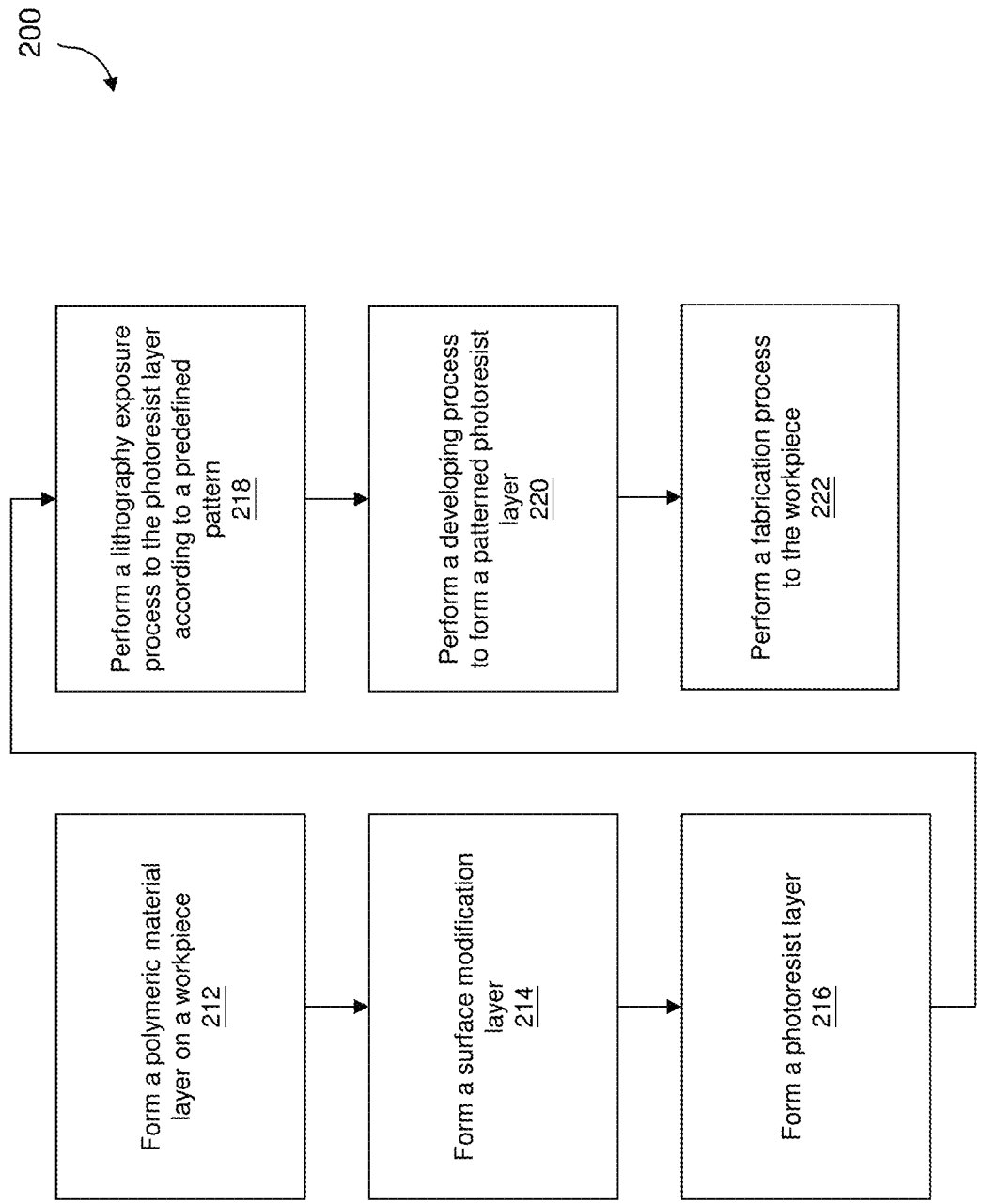
FIG. 19 is a flowchart of a method for a photolithography process constructed according aspects of the present disclosure in one embodiment.

FIG. 19 is a flowchart of a method 200 to pattern a workpiece, such as the semiconductor structure 100, constructed in accordance with some embodiments. The method 200 may include an operation 212 by forming polymeric material layer, such as forming a under layer 118 and a middle layer 120 on the under layer 118 (as illustrated in FIG. 2B), or alternatively forming a BARC layer 116 on the workpiece (as illustrated in FIG. 2A). In the present embodiment, after the operation 212, the workpiece has a polymeric material layer with a hydrophobic top surface.

The method 200 further includes an operation 214 by forming a surface modification layer 114. The surface modification layer 114 has a hydrophilic top surface. The surface modification layer 114 is a polymeric material having hydrophilic characteristics.

In some embodiments, the polymeric material in the surface modification layer 114 includes a hydrophobic backbone with a plurality hydrophilic side chains bonded to the hydrophobic back. In one example of the polymeric material, the hydrophobic backbone includes polystyrene. A plurality of hydrophilic functional groups are bonded to the hydrophobic backbone. In some examples, each of the hydrophilic functional group includes $CH_2CH_2OH$, $CH_2CH_2COOH$, $CH_2NH_2$, $CH_2N(CH_3)_2$, or a combination thereof. In one example of the polymeric material, the hydrophobic backbone includes a hydrophobic backbone 152 having a plurality of repeating hydrophobic chemical groups bonded together to form a long chain. A plurality of hydrophilic functional groups are bonded to the hydrophobic backbone 152.

In some embodiments, the polymeric material in the surface modification layer 114 includes a block copolymer having a hydrophobic functional group and a hydrophilic functional group. In the present embodiment, the hydrophobic functional group is polystyrene and the hydrophilic functional group block is poly (methyl methacrylate) di COOH. The hydrophobic functional group and a hydrophilic functional group are bonded together to form the block copolymer. Especially, the hydrophilic functional group includes a diCOOH group bonded to the poly (methyl methacrylate).

In some embodiments, the polymeric material in the surface modification layer 114 includes hydrophilic functional group, such as hydroxyl group, acid group, or amine group. In furtherance of the embodiments, the polymeric material in the surface modification layer 114 includes polyvinylpyrrolidone, polyvinylpyridine, poly(diallydimethyl ammonium chloride), polyethyleneimine, polyacrylamide, polyamide, a polymer with primary amine group, a polymer with secondary amine group, a polymer with tertiary amine group, a polymer with quaternary ammonium group, or a combination thereof.

In some embodiments, the surface modification layer 114 has a thickness less than 5 nm, preferably less than 2 nm. The surface modification layer 114 is formed by spin coating, spray or vapor phase deposition. A pre-solution of the surface modification material is coated on the substrate by one of the above techniques and may be further baked, or collectively baked with subsequently formed photoresist. In some embodiments, before the coating, the pre-solution of the surface modification material is mixed with a resist reduced coating solution, thereby forming a diluted pre-solution, in order to tune the concentration of the pre-solution for optimized performance. In one example, the resist reduced coating solution includes propylene glycol monomethylether and propylene glycol monomethylether acetate, thereby forming a diluted pre-solution. In furtherance of the example, the resist reduced coating solution includes 70% Propylene glycol monomethylether and 30% propylene glycol monomethylether acetate, therefore also being referred to as OK73.

The method 200 proceeds to operation 216 by forming a photoresist layer 122 on the surface modification layer 114. The method 300 further includes an operation 218 by performing a lithography exposure process 122 according to a predefined pattern, such as a circuit pattern defined on a photomask. The method 200 also includes an operation 220 by performing a developing process to form a patterned photoresist layer. The pattern defined photoresist layer may be further transferred to the BARC layer, or to the middle and under layers. The method 300 includes an operation 222 by performing a fabrication process to the workpiece using the patterned photoresist layer 122, the patterned under layer 112 or the patterned BARC layer 116 as a mask such that the fabrication process is only applied to the portions of the workpiece within the openings of the corresponding patterned layer while other portions of the workpiece covered by the corresponding patterned layer is protected from being impacted by the fabrication process. In some embodiments, the fabrication process includes an etching process applied to the top material layer of the workpiece using the corresponding patterned layer as an etch mask. In some embodiments, the fabrication process includes an ion implantation process applied to the workpiece using the corresponding patterned layer as an implantation mask, thereby forming various doped features in the semiconductor substrate.

The present disclosure provides a lithography method and a surface modification layer used in the lithography method. By using the surface modification layer, the top surface of the workpiece for the photoresist layer to be coated on is modified to be hydrophilic. By implementing the disclosed method, some of advantages described below may present. However, it is understood that different embodiments disclosed herein offer different advantages and that no particular advantage is necessarily required in all embodiments. For example, during and after the lithography operations to form the patterned photoresist layer, the defects, such as water stain and solvent remain, on the patterned photoresist layer are eliminated or reduced. The method is cost effective and is easily applied to the lithography patterning operations. The BARC layer original functions, such as etching resistance and antireflection, are properly kept. The method may be used to reduce the defects without using the FIRM solution or nitrogen purge. For advanced technology nodes, a thin middle layer is able to be used with improved coating uniformity.

A lithography method is provided in accordance with some embodiments. The lithography method includes forming a surface modification layer on a substrate, the surface modification layer including a hydrophilic top surface; coating a photoresist layer on the surface modification layer; and developing the photoresist layer, thereby forming a patterned photoresist layer.

A lithography method is provided in accordance with some other embodiments. The lithography method includes forming an anti-reflective coating layer on a substrate, wherein the anti-reflective coating layer has a hydrophobic top surface; forming a surface modification layer on the hydrophobic top surface of the anti-reflective coating layer, wherein the surface modification layer includes a hydrophilic top surface; coating a photoresist layer on the hydrophilic top surface of the surface modification layer; performing a lithography exposure process to the photoresist layer; and developing the photoresist layer, thereby forming a patterned photoresist layer.

The lithography method includes forming a polymeric material layer on a substrate, wherein the polymeric material layer has a hydrophobic top surface; forming a surface modification layer on the hydrophobic top surface of the polymeric material layer; coating a photoresist layer on the surface modification layer; performing a lithography exposure process to the photoresist layer; and developing the photoresist layer, thereby forming a patterned photoresist layer. The surface modification layer includes a hydrophilic chemical group selected from the group consisting of polyvinylpyrrolidone, polyvinylpyridine, poly(diallydimethyl ammonium chloride), polyethyleneimine, polyacrylamide, polyamide, a polymer with primary amine group, a polymer with secondary amine group, a polymer with tertiary amine group, a polymer with quaternary ammonium group, and a combination thereof.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A lithography method, comprising:
forming a surface modification layer on a substrate by depositing a layer of polymeric molecules having hydrophilic side chains, wherein at least a portion of the hydrophilic side chains form a hydrophilic top surface;
coating a photoresist layer on the hydrophilic top surface of the surface modification layer;
performing a lithography exposure process to the photoresist layer; and
developing the exposed photoresist layer, thereby forming a patterned photoresist layer.

2. The method of claim 1, wherein the polymeric molecules each further comprises a hydrophobic backbone chemically or physically bonded to the hydrophilic side chains.

3. The method of claim 2, wherein the hydrophobic backbone includes a plurality of repeating benzene derivatives each being bonded to a hydrophilic chemical structure R.

4. The method of claim 3, wherein the hydrophilic chemical structure R is selected from the group consisting of $CH_2CH_2OH$, $CH_2CH_2COOH$, $CH_2SO_3H$, $CH_2PO_4H$, $CH_2NH_2$, and $CH_2N(CH_3)_2$.

5. The method of claim 3, wherein the hydrophobic backbone is polystyrene and the hydrophilic chemical structure R is bonded to the polystyrene formulated as,

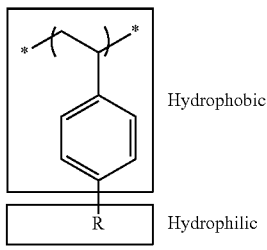

6. The method of claim 3, wherein each of the plurality of repeating benzene derivatives bonded with the hydrophilic chemical structure R is formulated as

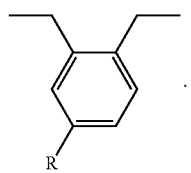

7. The method of claim 1, wherein the surface modification layer includes a block copolymer having a hydrophobic block bonded with a hydrophilic block.

8. The method of claim 7, wherein the block copolymer is polystyrene-b-poly (methyl methacrylate) di COOH, formulated as

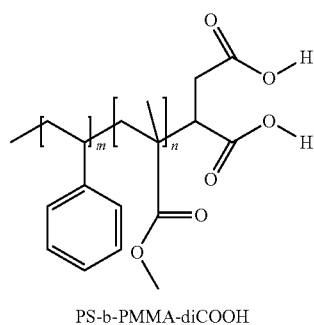

PS-b-PMMA-diCOOH wherein O and H represent oxygen and hydrogen, respectively; and
m and n are integers, respectively.

9. The method of claim 1, wherein the surface modification layer includes a hydrophilic chemical group selected from the group consisting of hydroxyl group, acid group, amine group and a combination thereof.

10. The method of claim 1, wherein the surface modification layer includes a hydrophilic chemical group selected from the group consisting of polyvinylpyrrolidone, polyvinylpyridine, poly(diallydimethyl ammonium chloride), polyethyleneimine, polyacrylamide, polyamide, a polymer with primary amine group, a polymer with secondary amine group, a polymer with tertiary amine group, a polymer with quaternary ammonium group, and a combination thereof.

11. The method of claim 1, further comprising forming a bottom anti-reflective coating layer on the substrate, wherein
the forming of the surface modification layer includes forming the surface modification layer on the bottom anti-reflective coating layer; and
the bottom anti-reflective coating layer includes one of a nitrogen-containing chemical formulated as

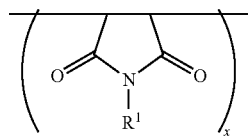

and a novolac resin type chemical formulated as

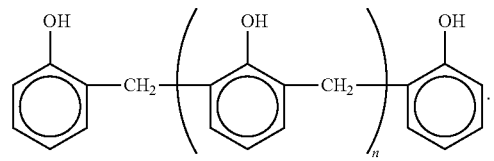

12. The method of claim 11, wherein the forming of the surface modification layer includes:
mixing a pre-solution of a hydrophilic material with a solvent, thereby forming a diluted pre-solution; and
applying the diluted pre-solution to the substrate by one of spin-coating, spray coating and vapor phase deposition.

13. The method of claim 12, wherein the solvent includes propylene glycol monomethylether and propylene glycol monomethylether acetate.

14. The method of claim 1, further comprising:
forming a bottom material layer on the substrate; and forming a middle layer of a silicon-containing polymeric material on the bottom material layer, wherein the forming of the surface modification layer includes forming the surface modification layer on the middle layer.

15. The method of claim 14, wherein the forming of the middle layer includes:
coating the substrate with a solution having the silicon-containing polymeric material; and
performing a curing process to the solution, thereby cross-linking the silicon-containing polymeric material to form the middle layer.

16. The method of claim 1, wherein the developing of the exposed photoresist layer includes:
applying a developing solution to the photoresist layer, thereby forming a patterned photoresist layer;
applying deionized water to the patterned photoresist; and
applying a solution having deionized water and surfactant.

17. A lithography method, comprising:
forming an anti-reflective coating layer on a substrate, wherein the anti-reflective coating layer has a hydrophobic top surface;
depositing a surface modification layer on and physically contacting the hydrophobic top surface of the anti-reflective coating layer, wherein the surface modification layer includes a hydrophilic top surface;
coating a photoresist layer on the hydrophilic top surface of the surface modification layer;
performing a lithography exposure process to the photoresist layer; and
developing the photoresist layer, thereby forming a patterned photoresist layer.

18. The lithography method of claim 17, wherein the surface modification layer includes polymeric molecules each having a hydrophobic backbone and hydrophilic side chains chemically or physically bonded to the hydrophobic backbone.

19. The method of claim 18, wherein the hydrophobic backbone includes a plurality of repeating benzene derivatives each being bonded to a hydrophilic chemical structure R, wherein the hydrophilic chemical structure R is selected from the group consisting of $CH_2CH_2OH$, $CH_2CH_2COOH$, $CH_2SO_3H$, $CH_2PO_4H$, $CH_2NH_2$, and $CH_2N(CH_3)_2$.

20. The method of claim 17, wherein the surface modification layer includes a block copolymer having a hydrophobic block bonded with a hydrophilic block, wherein the block copolymer is polystyrene-b-poly (methyl methacrylate) di COOH.

21. A lithography method, comprising:
forming a polymeric material layer on a substrate, wherein the polymeric material layer has a hydrophobic top surface;
depositing a surface modification layer on and physically contacting the hydrophobic top surface of the polymeric material layer;
coating a photoresist layer on the surface modification layer;
performing a lithography exposure process to the photoresist layer; and
developing the photoresist layer, thereby forming a patterned photoresist layer, wherein
the surface modification layer includes a hydrophilic chemical group selected from the group consisting of polyvinylpyrrolidone, polyvinylpyridine, poly(diallydimethyl ammonium chloride), polyethyleneimine, polyacrylamide, polyamide, a polymer with primary amine group, a polymer with secondary amine group, a polymer with tertiary amine group, a polymer with quaternary ammonium group, and a combination thereof.

\* \* \* \* \*